United States Patent [19]
Hurwitt

[11] Patent Number: 5,804,041
[45] Date of Patent: Sep. 8, 1998

[54] METHOD AND APPARATUS FOR FORMING A MAGNETICALLY ORIENTED THIN FILM

[75] Inventor: Steven Hurwitt, Park Ridge, N.J.

[73] Assignees: Sony Corporation, Tokyo, Japan; Materials Research Corp., Orangeburg, N.Y.

[21] Appl. No.: 662,731

[22] Filed: Jun. 10, 1996

[51] Int. Cl.⁶ .................................................. C23C 14/34
[52] U.S. Cl. ............................... 204/192.2; 204/192.13; 204/298.16
[58] Field of Search .......................... 204/192.1, 192.13, 204/192.15, 192.2, 298.16; 427/130, 131

[56] References Cited

U.S. PATENT DOCUMENTS

| | | | |
|---|---|---|---|
| 4,911,815 | 3/1990 | Kamei et al. | 204/192.2 |
| 5,242,761 | 9/1993 | Uchiyama | 204/192.2 |
| 5,290,416 | 3/1994 | Tong et al. | 204/298.16 |
| 5,589,039 | 12/1996 | Hsu | 204/192.2 |
| 5,630,916 | 5/1997 | Gerrish et al. | 204/298.16 |

*Primary Examiner*—R. Bruce Breneman
*Assistant Examiner*—Rodney G. McDonald
*Attorney, Agent, or Firm*—Pasquale Musacchio; Jerry A. Miller

[57] ABSTRACT

A method for forming a magnetically oriented thin film on a substrate is disclosed wherein deposition pulses are alternated with magnetic field pulses. In particular, the method includes sputtering a target to deposit a first incremental layer of target material on the substrate, wherein the target is sputtered for a first sputtering time period and the first incremental layer includes randomly oriented first domains. The method further includes generating a magnetic field for orienting the first in a desired direction, wherein the magnetic field is generated for a first magnetic field time period which begins after the first sputtering time period ends. In addition, the method includes sputtering the target to deposit a second incremental layer of target material upon the first incremental layer; wherein the target is sputtered for a second sputtering time period which begins after the first magnetic field time period ends and the second incremental layer includes randomly oriented second domains. The magnetic field is then generated which orients the second domains in the desired direction, the magnetic field being generated for a second magnetic field time period which begins after the second sputtering time period ends. The steps of sputtering the target and generating the magnetic field are then repeated to form successive incremental layers each having associated domains which are oriented in the desired direction by the magnetic field to form a thin film on the substrate whose domains are oriented in the desired direction.

26 Claims, 8 Drawing Sheets

METHOD AND APPARATUS FOR FORMING A MAGNETICALLY ORIENTED THIN FILM

FIELD OF THE INVENTION

This invention relates to the sputtering of magnetic materials for reading and writing heads, and more particularly, to a method for forming a magnetically oriented thin film by depositing incremental layers on a substrate whose domains are oriented in a desired direction by a magnetic field and wherein deposition does not occur simultaneously with the generation of a magnetic field used for orienting magnetic domains.

BACKGROUND OF THE INVENTION

Sputter deposition is a generally known method for depositing a thin layer or film of material onto the surface of a substrate. In particular, sputtered thin films are frequently used in the manufacture of reading and writing heads utilized to store or retrieve data from magnetic recording discs. Films for such heads are typically made from magnetic materials which include alloys of nickel, iron and cobalt. However, the use of conventional sputtering techniques, such as in RF diode sputtering, to sputter magnetic materials results in the formation of groups of atoms in the film known as magnetic domains. Referring to FIG. 1, a first film layer 10 having a plurality of domains 12 is shown formed on a substrate 14. By way of example, a film layer may be between 50 to 1000 angstroms thick and each of the domains 12 may be between 25 to 1000 angstroms in size. Each of the domains 12 has a magnetic direction 16 (depicted by arrow). In the absence of any strong magnetic influence during deposition, each of the domains 12 orient themselves randomly with respect to magnetic direction. This is a disadvantage since several performance characteristics of heads, such as signal strength, sensitivity and others, become undesirably degraded due to random orientation. Further, once the film layer 10 has been formed, reorientation of the magnetic direction 16 of each of the domains 12 is extremely difficult. Therefore, in order to enhance head performance, material to be deposited is subjected to a controlled magnetic field during the sputtering process. This serves to orient the magnetic direction 16 of each of the domains 12 in a desired direction.

A system 30 for depositing a magnetically oriented thin film is shown in FIG. 2. The system 30 includes a chamber 18 which is evacuated by a vacuum pump 20 to a vacuum level suitable for sputtering. The chamber 18 includes a target mounting element 22 for holding a target 24 from which target material is removed, or sputtered, that is ultimately deposited on a second substrate 26 to form a second film layer 28. The system 30 further includes a support 32 for holding the second substrate 26 in a position generally opposite the target 24. In use, a sputtering gas is introduced into the chamber 18 through a nozzle 34. The target 24 is then energized by a high frequency power supply 36 to cause an emission of electrons from the target 24. This results in the formation of a plasma 62 (shown as dashed lines) having positively charged ions. The ions then bombard the target 24 to initiate a sputtering process wherein target material is removed from the target 24 and is ultimately deposited on the second substrate 26. Further, the plasma 62 may be shaped so as to erode the target 24 in a desired pattern for providing a substantially uniform film thickness on the second substrate 26.

In addition, the system 30 includes a substantially U-shaped magnetic yoke 38 having a horizontal member 40 located between vertical first 42 and second 44 members which extend into the chamber 18. The first 42 and second 44 members include first 46 and second 48 magnetic pole pieces, respectively, which are spaced apart from each other to form a gap region 50 therebetween. An electromagnetic coil 52 is wrapped around the horizontal member 40. The coil 52 is energized by a magnet power supply 54 to create a magnetic field 56 (depicted by arrow) in the gap region 50. The magnetic field 56 serves to orient domains which are formed during the sputtering process in a desired direction. Further, the system 30 includes a switch 64 for energizing and de-energizing the coil 52.

In use, the coil 52 is first energized, thus creating magnetic field 56. Subsequently, target 24 is energized to cause the formation of the plasma 62, thus initiating a sputtering process. However, it has been found that the magnetic field 56 undesirably interacts with the plasma 62 so as to distort the desired shape of the plasma 62. In particular, a central portion 63 of the plasma 62 is flattened due to the magnetic field 56. This causes the formation of areas of higher and lower plasma intensity, which result in a film having a non-uniform thickness. Referring to FIG. 3 in conjunction with FIG. 2, an enlarged view of the first 46 and second 48 pole pieces, magnetic field 56, second film layer 28 and the second substrate 26 is shown. FIG. 3 illustrates oriented domains 58 that are formed in the second film layer 28 each having magnetic directions 60 (indicated by arrows) which are oriented in accordance with the magnetic field 56. However, as previously described, magnetic field 56 may cause, for example, a first portion of the second film layer 28 to have a first thickness 29 which is greater than a second thickness 31 of a second portion. A method utilized to improve film uniformity is to increase the distance between the target 24 and the first 46 and second 48 pole pieces, thereby separating magnetic field 56 from plasma 62. However, this introduces a different mode of film non-uniformity which is related to excessive sputtering distance between the target 24 and the second substrate 26. Another method is to alternate the direction of magnetic field 56 by switching the polarity of magnet power supply 54 several times during the deposition process. This averages out a portion of the non-uniformity, but still results in substantial non-uniformities in the film.

Therefore, it is an object of the present invention to provide a method and apparatus for forming a magnetically oriented thin film which does not degrade film uniformity.

SUMMARY OF THE INVENTION

A method for forming a magnetically oriented thin film on a substrate is disclosed. The method includes sputtering a target to deposit a first incremental layer of target material on the substrate, wherein the target is sputtered for a first sputtering time period and the first incremental layer includes randomly oriented first domains. The method further includes generating a magnetic field for orienting the first domains in a desired direction, wherein the magnetic field is generated for a first magnetic field time period which begins after the first sputtering time period ends. In addition, the method includes sputtering the target to deposit a second incremental layer of target material upon the first incremental layer; wherein the target is sputtered for a second sputtering time period which begins after the first magnetic field time period ends and the second incremental layer includes randomly oriented second domains. The magnetic field is then generated which orients the second domains in the desired direction, the magnetic field being generated for a second magnetic field time period which begins after the second sputtering time period ends. The steps of sputtering the target and generating the magnetic field are then repeated to form successive incremental layers each having associated domains which are oriented in the desired direction by the magnetic field to form a thin film on the substrate whose domains are oriented in the desired direction.

DETAILED DESCRIPTION OF THE INVENTION

Figure 1:
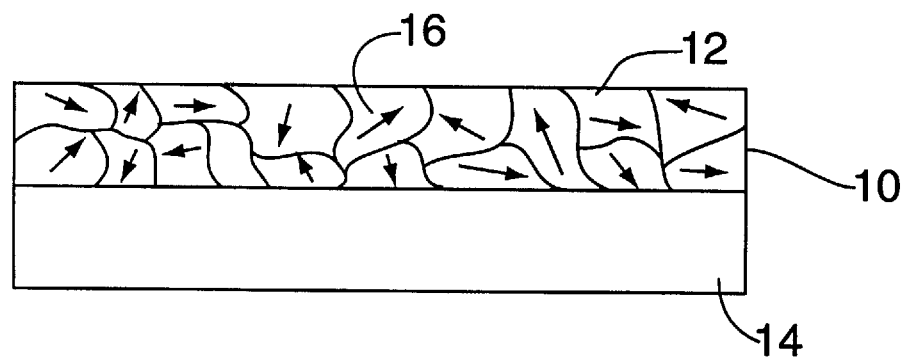
FIG. 1 depicts a first film layer having randomly oriented domains.
Figure 2:
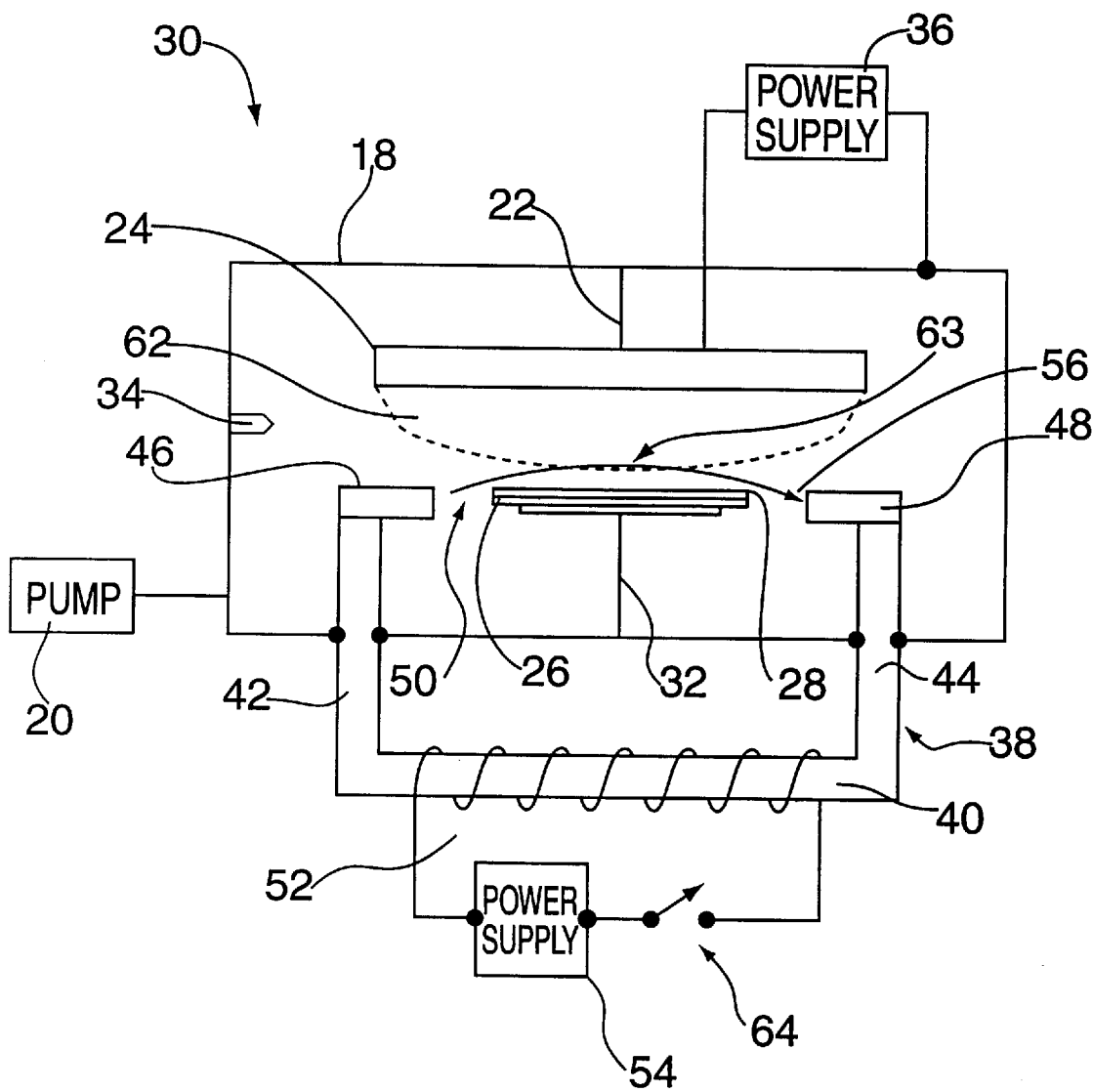
FIG. 2 illustrates a system for depositing a magnetically oriented thin film.
Figure 3:
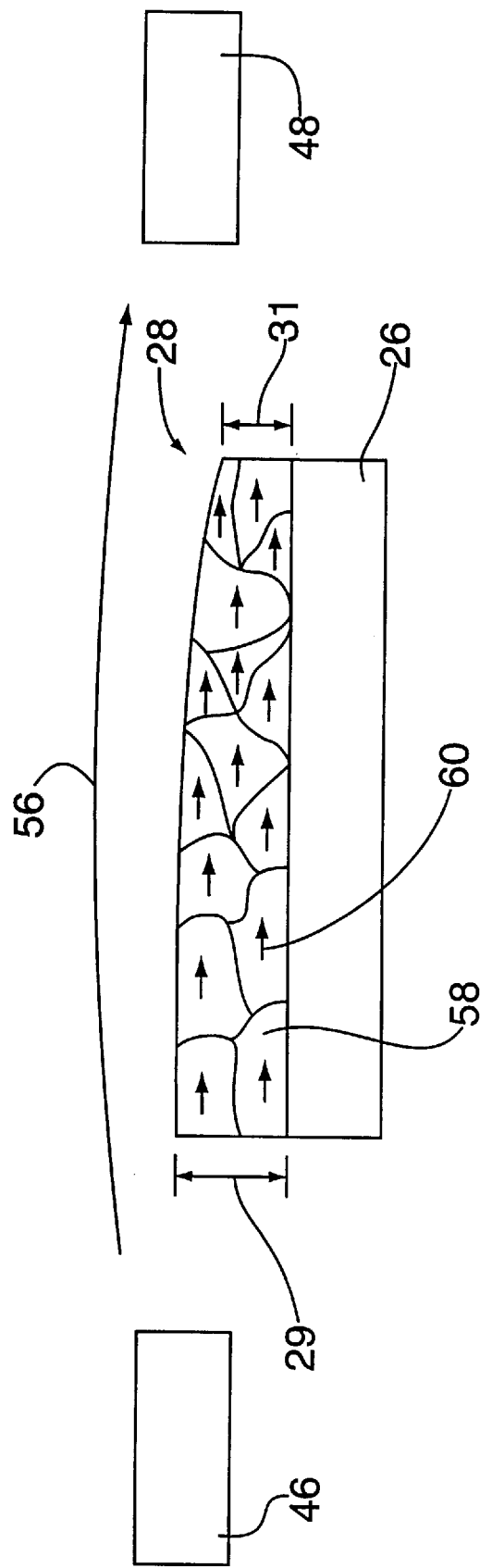
FIG. 3 is an enlarged view of first and second pole pieces, magnetic field, second film layer and second substrate shown in FIG. 2.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in FIGS. 1–7C.

Figure 4:
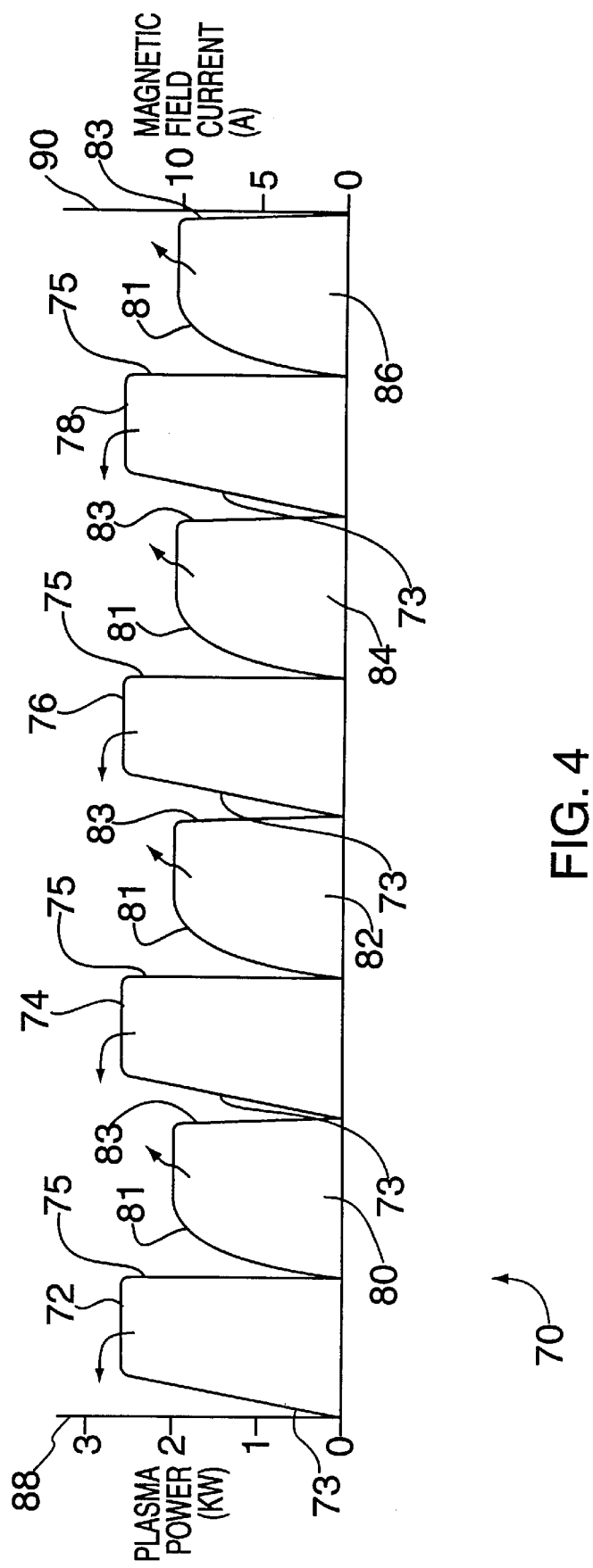
FIG. 4 is a first embodiment of a chart depicting first, second, third and fourth deposition and magnetic field pulses for operating a system.

Referring to FIG. 4, a first embodiment of a chart 70 is shown which depicts first 72, second 74, third 76 and fourth 78 deposition pulses and first 80, second 82, third 84 and fourth 86 magnetic field pulses for controlling operation of the system 30. However, it is understood that a greater or lesser number of either the deposition or magnetic field pulses may be utilized. The chart 70 further includes a left vertical plasma power axis 88 for indicating an amount of power utilized to energize the target 24 during each of the deposition pulses 72,74,76,78. In addition, the chart 70 includes a right vertical coil current axis 90 for indicating an amount of coil current used to generate each of the magnetic field pulses 80,82,84,86.

Each of the deposition pulses 72,74,76,78 illustrate a predetermined deposition time period during which deposition occurs. In particular, each of the deposition pulses 72, 74, 76, 78 include a power-on section 73 during which power is applied to the target 24 at a predetermined rate until a desired power level is reached. Further, each of the deposition pulses 72, 74, 76, 78 include a substantially vertical power drop-off section 75 wherein the power level is decreased to zero in a relatively short period of time.

In addition, each of the magnetic field pulses 80,82,84,86 illustrate a predetermined magnetic field time period during which magnetic field 56 is generated. Each of the magnetic field pulses 80,82,84,86 include a current-on section 81 during which current is applied to the coil 52 at a predetermined rate until a desired current is reached. In addition, each of the magnetic field pulses 80,82,84,86 include a substantially vertical current drop-off section 83 wherein the current is decreased to zero in a relatively short period of time.

In accordance with the present invention, the first deposition pulse 72 and the fourth magnetic field pulse 86 occur first and last, respectively. Further, the first 80, second 82 and third 84 magnetic field pulses occur between the first 72 and second 74, second 74 and third 76, and third 76 and fourth 78 deposition pulses, respectively. In one embodiment, each current-on section 81 begins immediately after a previous power drop-off section 75 returns to zero and the power-on sections 73 of the second 74, third 76 and fourth 78 deposition pulses begin after the current drop-off sections 83 of the first 80, second 82, third 84 magnetic field pulses, respectively, return to zero without a time delay occurring therebetween. This results in an alternating sequence wherein deposition occurs only when magnetic field 56 is turned off and wherein magnetic field 56 is generated only when no deposition occurs. As such, the deposition 72,74,76,78 and magnetic field pulses 80,82,84, 86 do not overlap each other. Therefore, no interaction occurs between the plasma 62 and the magnetic field 56 which undesirably distorts the plasma 62 and causes the formation of a film having a non-uniform thickness.

Figure 5:
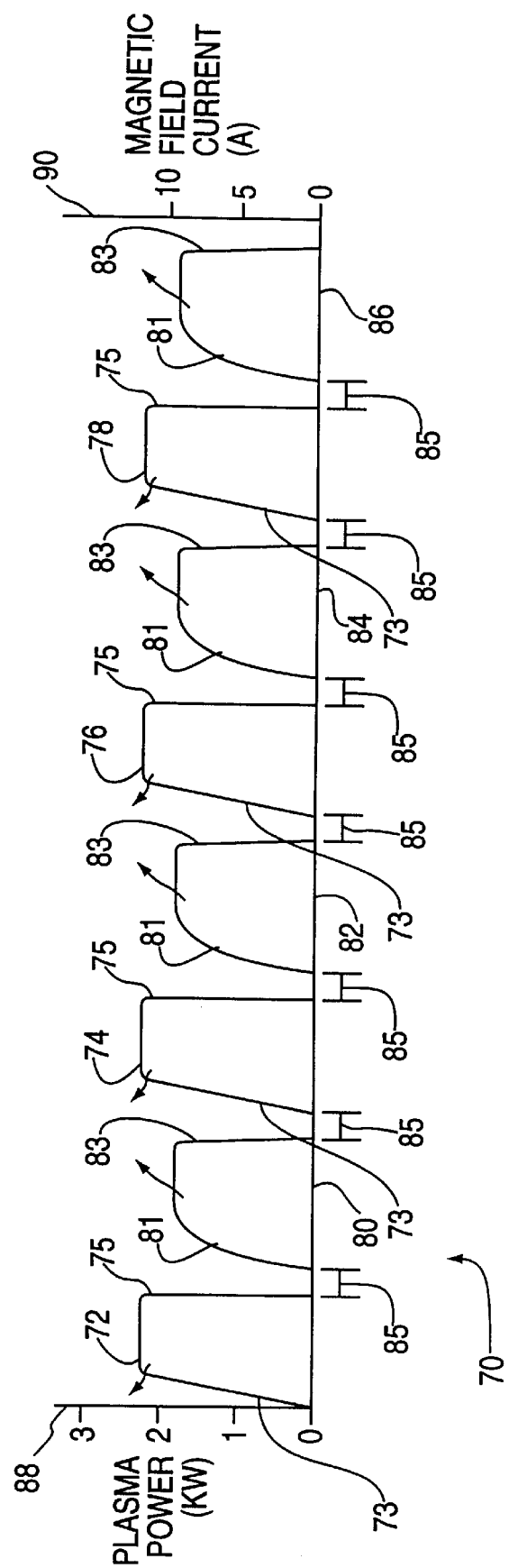
FIG. 5 is a second embodiment of the chart.

Referring to FIG. 5, a second embodiment of the time chart 70 is shown. In this embodiment, a predetermined time delay 85 occurs between the power drop-off sections 75 of the deposition pulses 72,74,76,78 and the current-on sections 81 of the magnetic field pulses 80,82,84,86, respectively. In addition, the time delay 85 also occurs between current drop-off sections 83 of the first 80, second 82 and third 84 magnetic field pulses and the power-on sections 73 of the second 74, third 76 and fourth 78 deposition pulses, respectively.

Figure 6:
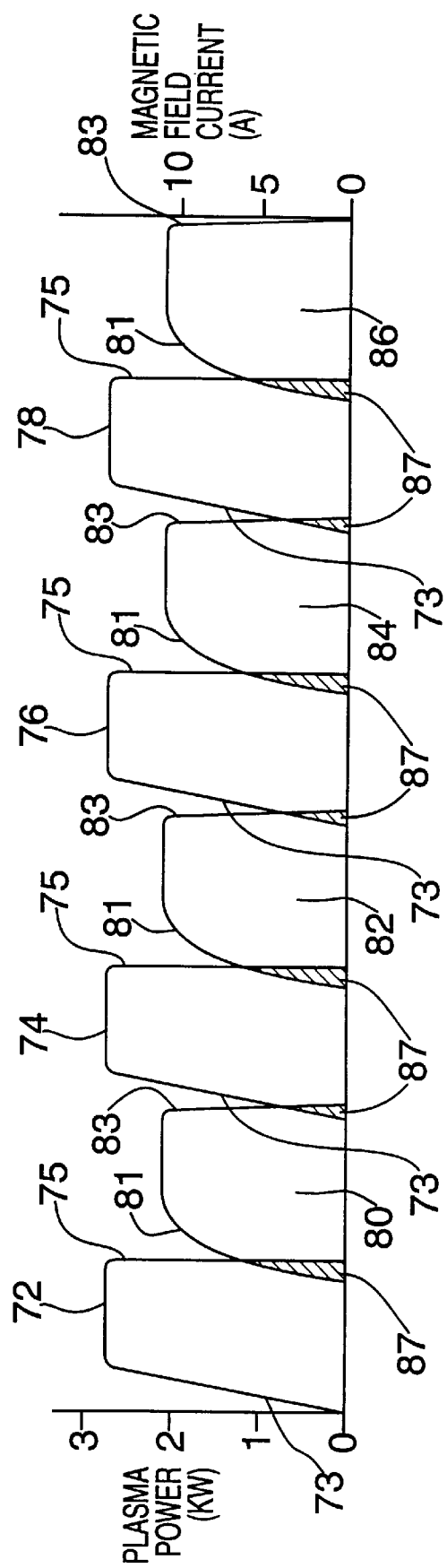
FIG. 6 is a third embodiment of the chart.

Referring to FIG. 6, a third embodiment of the time chart 70 is shown. In this embodiment, the power drop-off sections 75 of the deposition pulses 72,74,76,78 cross the current-on sections 81 of the magnetic field pulses 80,82, 84,86, respectively. In addition, the current drop-off sections 83 of the first 80, second 82 and third 84 magnetic field pulses cross the power-on sections 73 of the second 74, third 76 and fourth 78 deposition pulses, respectively, to form overlap areas 87. The overlap areas 87 occur at relatively low plasma power levels wherein relatively minimal deposition occurs which results in a negligible effect on film uniformity. By way of example, the area of a deposition pulse exclusive of the overlap areas 87 (i.e. the area of the deposition pulse wherein the coil current is not on) may be approximately 50% of the total area of the deposition pulse. In addition, to further minimize any effects on film uniformity due to magnetic field 56 in the overlap areas 87, the direction of magnetic field 56 may be periodically reversed.

Figure 7A:
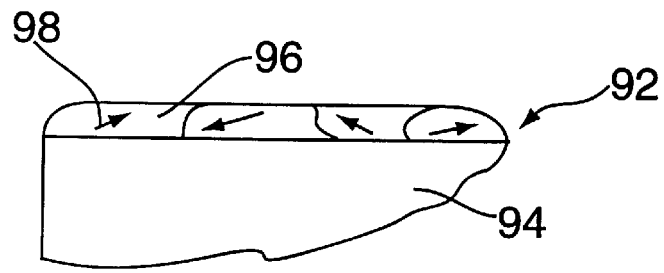
FIGS. 7A–7C illustrate the formation of an incremental layer having domains which are oriented by a magnetic field and a third film layer having domains oriented in a desired direction.
Figure 7B:
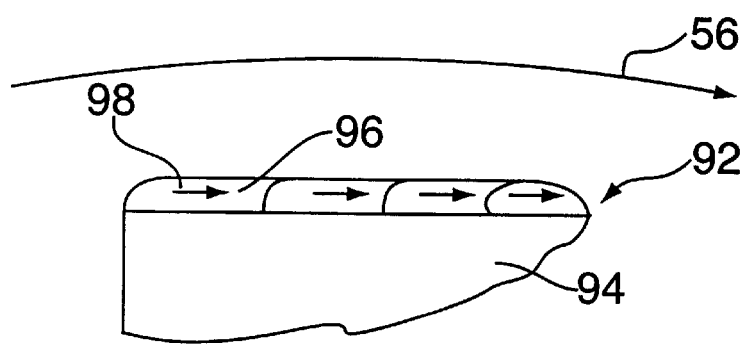

Each deposition time period is of a relatively short duration suitable for forming an incremental layer that forms a relatively small portion of a film layer. Referring to FIG. 7A, a first incremental layer 92 formed on a third substrate 94 as a result of the first deposition pulse 72 is shown. During the first deposition pulse 72, magnetic field 56 is turned off. As such, domains 96 are formed in the first incremental layer 92 each having a magnetic direction 98 (indicated by arrow) that is randomly oriented. The first magnetic field pulse 80 is then generated which turns on magnetic field 56. As previously described, it is extremely difficult to orient domains in a fully formed film layer. In accordance with the present invention, the thickness of the first incremental layer 92 is sufficiently small so as to enable the magnetic field 56 to orient the domains 96 in a desired direction. In this regard, it is noted that one of ordinary skill in the art would be readily able to determine a duration for a deposition pulse which is suitable for providing a sufficiently thin incremental layer. By way of example, the first incremental layer 92 may have a thickness between approximately 1–100 atoms. Referring to FIG. 7B, the domains 96 are shown each having a magnetic direction 98 oriented in a desired direction in accordance with magnetic field 56.

Figure 7C:
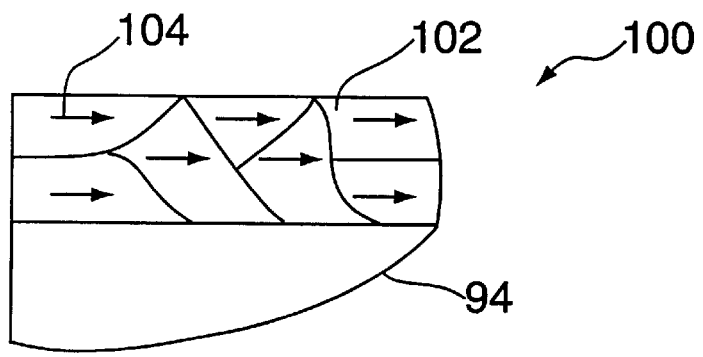

This process is then repeated by generating pairs of deposition and magnetic field pulses in accordance with the chart 70. Referring to FIG. 7C in conjunction with FIG. 4, pairs of deposition and magnetic field pulses which include the second deposition 74 and second magnetic field 82 pulses, the third deposition 76 and third magnetic field 84 pulses and the fourth deposition 78 and fourth magnetic field 86 pulses are then generated each of which result in the formation of an associated incremental layer whose domains are oriented by magnetic field 56. This results in the formation of a third film layer 100 which includes domains 102 each having a magnetic direction 104 (indicated by arrow) that is oriented in accordance with magnetic field 56. In addition, it is noted that each incremental layer, in conjunction with the magnetic field 56, assists in the orientation of a next incremental layer which is deposited. As such, a magnetically oriented film layer is formed by a process which does not degrade film uniformity.

Figure 8:
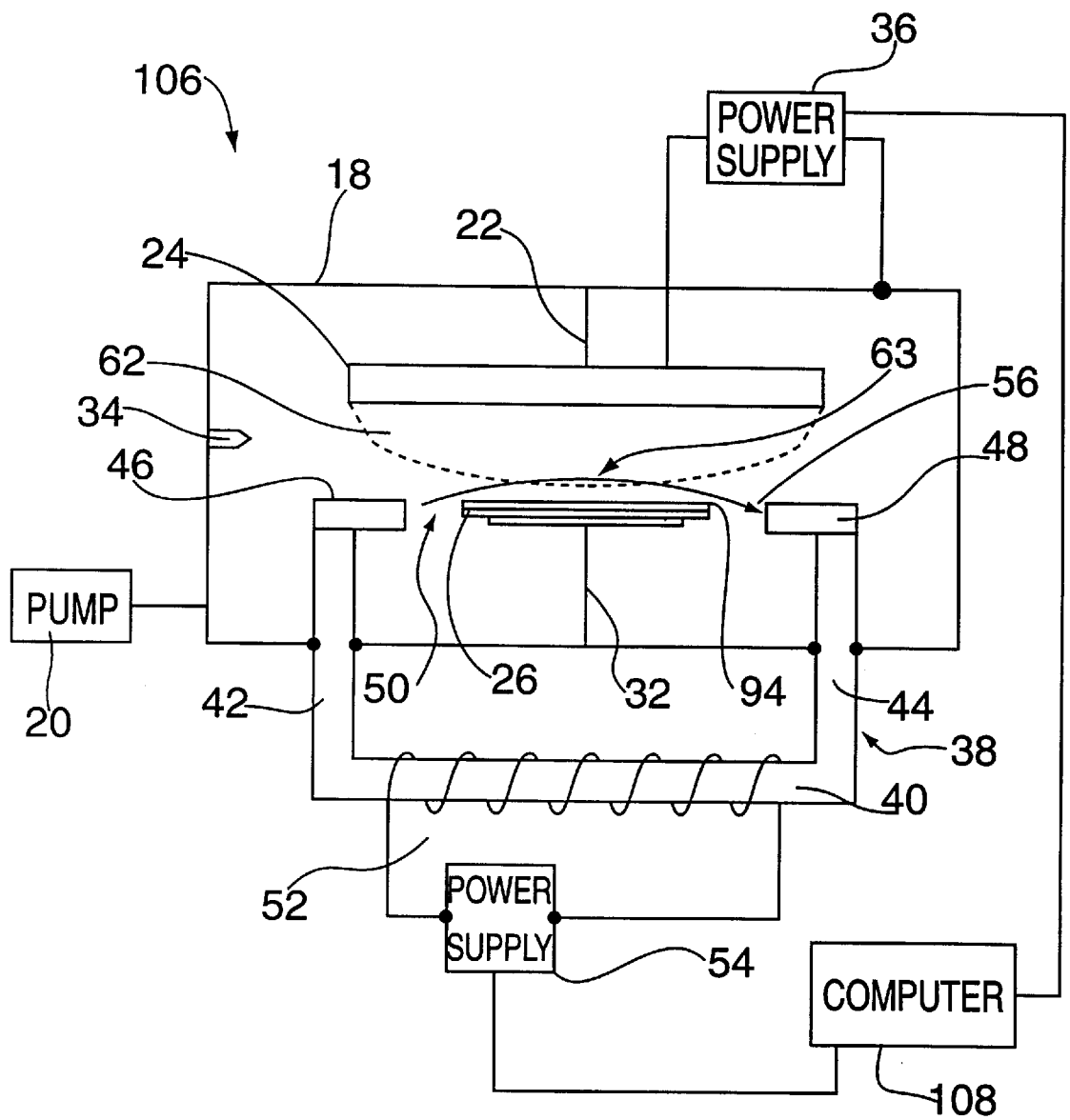
FIG. 8 depicts a sputtering system for forming a magnetically oriented thin film in accordance with the present invention.

Referring to FIG. 8, a sputtering system 106 in accordance with the present invention is shown. The system 106 includes a micro controller, programmable computer 108 or other similar device which serves to control on/off operation of the high frequency power supply 36 and the magnet power supply 54. This enables alternate generation of the deposition pulses 72,74,76,78 and the magnetic field pulses 80,82,84,86 in accordance with either of the charts 70 previously described in relation to FIGS. 4, 5 and 6. Further, the computer 108 may be programmed such that the deposition pulses 72,74,76,78 may vary in duration relative to each other so as to enable the formation of incremental layers having varying thicknesses. In addition, the magnetic field pulses 80,82,84,86 may also vary in duration relative to each other to correspond with the deposition pulses 72,74, 76,78. For example, the amount of time that target 24 and coil 52 are each energized may be controlled by the computer 108 so as to control the duration of the deposition pulses 72,74,76,78 and the magnetic field pulses 80,82,84, 86.

Thus it is apparent that in accordance with the present invention, an apparatus that fully satisfies the objectives, aims and advantages is set forth above. While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations are far within the scope of the appended claims.

What is claimed is:

1. A method for forming a magnetically oriented thin film on a substrate, comprising the steps of:

(a) sputtering a target to deposit a first incremental layer of target material on said substrate, said target being sputtered for a first sputtering time period and said first incremental layer having randomly oriented first domains;

(b) generating a magnetic field for orienting said first domains in a desired direction, said magnetic field being generated for a first magnetic field time period which begins after said first sputtering time period ends;

(c) sputtering said target to deposit a second incremental layer of target material upon said first incremental layer; said target being sputtered for a second sputtering time period which begins after said first magnetic field time period ends, said second incremental layer having randomly oriented second domains;

(d) generating said magnetic field for orienting said second domains in said desired direction, said magnetic field being generated for a second magnetic field time period which begins after said second sputtering time period ends; and (e) repeating steps (c) and (d) to form successive incremental layers each having associated domains which are oriented in said desired direction by said magnetic field to form a thin film on said substrate whose domains are oriented in said desired direction.

2. The method according to claim 1, wherein a time delay occurs between at least one magnetic field time period and an adjacent sputtering time period.

3. The method according to claim 1, wherein an overlap occurs between at least one magnetic field time period and an adjacent sputtering time period.

4. The method according to claim 3, wherein an area of a sputtering time period exclusive of said overlap is approximately 50% of a total area of said sputtering time period.

5. The method according to claim 3, wherein said magnetic field is periodically reversed.

6. The method according to claim 1, wherein said first, second and successive incremental layers are between approximately 1 to 100 atoms thick.

7. The method according to claim 1, wherein thicknesses of said first, second and successive incremental layers are not equal to each other.

8. The method according to claim 1, wherein the duration of said first sputtering time period is equal to the duration of said second sputtering time period.

9. The method according to claim 1, wherein the duration of said first sputtering time period is not equal to the duration of said second sputtering time period.

10. The method according to claim 1, wherein the duration of said first magnetic field time period is equal to the duration of said second magnetic field time period.

11. The method according to claim 1, wherein the duration of said first magnetic field time period is not equal to the duration of said second magnetic field time period.

12. The method according to claim 1, wherein the duration of said first and second sputtering and magnetic field time periods is computer controlled.

13. The method according to claim 1, wherein said magnetically oriented thin film is formed by RF diode sputtering.

14. A method for forming a magnetically oriented thin film on a substrate, comprising the steps of:

(a) providing a plasma having a predetermined shape adapted for sputtering a target to deposit a first incremental layer of target material on said substrate, said target being sputtered for a first sputtering time period and said first incremental layer having randomly oriented first domains;

(b) generating a magnetic field for orienting said first domains in a desired direction, said magnetic field being generated for a first magnetic field time period which begins after said first sputtering time period ends;

(c) sputtering said target to deposit a second incremental layer of target material upon said first incremental layer; said target being sputtered for a second sputtering time period which begins after said first magnetic field time period ends, said second incremental layer having randomly oriented second domains;

(d) generating said magnetic field for orienting said second domains in said desired direction, said magnetic field being generated for a second magnetic field time period which begins after said second sputtering time period ends; and (e) repeating steps (c) and (d) to form successive incremental layers each having associated domains which are oriented in said desired direction by said magnetic field to form a thin film on said substrate whose domains are oriented in said desired direction and whereby said predetermined shape is not changed by said magnetic field.

15. The method according to claim 14, wherein a time delay occurs between at least one magnetic field time period and an adjacent sputtering time period.

16. The method according to claim 14, wherein an overlap occurs between at least one magnetic field time period and an adjacent sputtering time period.

17. The method according to claim 16, wherein an area of a sputtering time period exclusive of said overlap is approximately 50% of a total area of said sputtering time period.

18. The method according to claim 16, wherein said magnetic field is periodically reversed.

19. The method according to claim 14, wherein said first, second and successive incremental layers are between approximately 1 to 100 atoms thick.

20. The method according to claim 14, wherein thicknesses of said first, second and successive incremental layers are not equal to each other.

21. The method according to claim 14, wherein the duration of said first sputtering time period is equal to the duration of said second sputtering time period.

22. The method according to claim 14, wherein the duration of said first sputtering time period is not equal to the duration of said second sputtering time period.

23. The method according to claim 14, wherein the duration of said first magnetic field time period is equal to the duration of said second magnetic field time period.

24. The method according to claim 14, wherein the duration of said first magnetic field time period is not equal to the duration of said second magnetic field time period.

25. The method according to claim 14, wherein the duration of said first and second sputtering and magnetic field time periods is computer controlled.

26. The method according to claim 14, wherein said magnetically oriented thin film is formed by RF diode sputtering.

* * * * *